(12) United States Patent
Shao et al.

(10) Patent No.: US 9,146,270 B2
(45) Date of Patent: Sep. 29, 2015

(54) METHOD FOR TESTING A PLURALITY OF TRANSISTORS IN A TARGET CHIP

(71) Applicant: Semitronix Corporation, Hangzhou, Zhejiang (CN)

(72) Inventors: Kangpeng Shao, Zhejiang (CN); Yongjun Zheng, Zhejiang (CN); Xu Ouyang, Zhejiang (CN)

(73) Assignee: SEMITRONIX CORPORATION, Hangzhou (CN)

( * ) Notice: Subject to any disclaimer, the term of this patent is extended or adjusted under 35 U.S.C. 154(b) by 80 days.

(21) Appl. No.: 14/178,029

(22) Filed: Feb. 11, 2014

(65) Prior Publication Data

US 2015/0002184 A1 Jan. 1, 2015

(30) Foreign Application Priority Data

Jun. 28, 2013 (CN) .......................... 2013 1 0268477

(51) Int. Cl.
*G01R 31/26* (2014.01)
*G01R 31/28* (2006.01)
(52) U.S. Cl.
CPC ........ *G01R 31/2607* (2013.01); *G01R 31/2818* (2013.01)

(58) Field of Classification Search
USPC ................... 324/762.06, 762.01, 750.3, 537, 324/762.09, 762.03, 756.01, 759.03, 324/762.02, 762.08; 257/E27.046, 777; 438/14, 15, 17, 18, 455, 16
See application file for complete search history.

(56) References Cited

U.S. PATENT DOCUMENTS

| | | | | |
|---|---|---|---|---|
| 5,225,771 | A * | 7/1993 | Leedy | ....................... 324/755.04 |
| 5,627,478 | A * | 5/1997 | Habersetzer et al. | ...... 324/750.3 |
| 6,551,844 | B1 * | 4/2003 | Eldridge et al. | ................ 438/14 |

* cited by examiner

*Primary Examiner* — Melissa Koval
*Assistant Examiner* — Nasima Monsur
(74) *Attorney, Agent, or Firm* — Syncoda LLC; Feng Ma

(57) ABSTRACT

The present invention relates to the chip testing field. A method for testing a plurality of transistors in a target chip is provided, characterized by automatically selecting a plurality of pre-defined transistors on the target chip and adding a connection layer to the key layers of each transistor such that the transistor to be tested is connected with and measured by an outside tester. Through automatic generation of the test structures and automatic wiring, the present invention greatly shortens the design cycle of test chips for target transistor testing, and greatly reduces the error probability in the process of designing test chips for target transistor testing, and improves the testing relevancy.

8 Claims, 2 Drawing Sheets

METHOD FOR TESTING A PLURALITY OF TRANSISTORS IN A TARGET CHIP

CROSS REFERENCE TO RELATED PATENT APPLICATION

The present application claims the priority of the Chinese patent application No. 201310268477.3 filed on Jun. 28, 2013.

BACKGROUND OF THE INVENTION

1. Technical Field

The present invention relates to the chip testing field, in particular to a method for testing a plurality of transistors in a target chip.

2. Description of Related Art

As microelectronic technology evolves, the integrated circuit industry now has entered an ultra-deep submicron phase. The critical dimensions of electronic devices become smaller and smaller and the chips bigger and bigger. Tens of millions of transistors and circuits can be integrated onto a single chip. The current state of the art semiconductor process node is 28 nm. The minimum line width of the corresponding layout becomes smaller and smaller, while the chip scale gets bigger and bigger and complexity higher and higher. At present, the mainstream lithographic technique is 198 nm lithography. During production of system chips, many factors have direct effects on the yield. Those factors include various short-circuit and open-circuit situations in the manufacturing process. It can be seen that, quantization of those factors is very important for improving the yield. Therefore, how to reduce defects in the manufacturing process and improve the yield is a severe problem in front of the semiconductor design and manufacturing company.

At present, methods for improving the yield mainly include:

(1) Optical proximity correction technology: The optical proximity effect is more obvious in the advanced process. The patterns on a wafer generated through a lithography machine are different from the layout practical_layout, thereby causing defects. Thus, before the lithography steps, the patterns on the mask were corrected through optical proximity correction technology, so the finally produced patterns are consistent with the original layout.

(2) Test chip technology: aiming at the problem that any process links of the semiconductor production may cause defects, this technology improves the yield by the following steps: test structures_proceeding tremendous data experiment design through using test structures, designing a test chip layout, manufacturing the test chip, testing this chip, and analyzing the testing data to find out causes of the defects in the process line. The test chip is of course designed to detect the causes of defects in the process line, comprised of a large number of test structures. Two methods for designing the test structures are as follows: (1) designing the parameterized units, and data experiment design; (b) finding out the positions required to be tested in the exiting chip layout.

(3) Design for Manufacturability (DFM): introduce some manufacturing rules in the process of chip design, and consider manufacturability. Reduce system defects to improve the yield.

Among the above three methods, the test chip technology is the most common one. Manufacturing the test chip requires creating test structures. At present, the method adopted in the industrial field is referring to the positions and patterns required to be noted in the product chip layout. Those positions and patterns include factors with effect on the yield that will be researched by users. Then, the test structures and the testing template are generated manually. Finally, the test chip template is electrically tested with instruments.

Generating the test structures manually requires to cut the chip layout_manually or to edit a layout_including areas of the positions required to be tested in a layout editor. A great number of positions with effect on the yield are required to be tested, so generating the test structures manually has the following shortcomings: (1) the product has a great number of positions required to be tested, even thousands, so it costs a lot of time in the manual generation mode; (2) generating the test structures manually is easy to get wrong.

Generating the test chip template manually is to arrange the pads in an array. The test structures are placed among the pads. After manual placement and wiring, the testing machine performs electric testing through the pads. Generating the test chip template manually has the following shortcomings: (1) there are tremendous test structures and may be thousands or tens of thousands, so it costs a lot of time to generate the test chip template through manual placement and wiring; (2) manual placement and wiring are easy to get wrong; (3) the utilization ratio of the area is very low, causing very high testing cost.

In conclusion: it is necessary to invent a new method for generating a test chip layout to solve the mentioned problems.

BRIEF SUMMARY OF THE INVENTION

Aiming at defects in the prior art, the present invention provides a method for testing a plurality of transistors in a target chip.

To solve the mentioned technical problem, the present invention is realized by the following technical solution:

A method for testing a plurality of transistors in a target chip is provided. Self-defined transistors on the target chip are automatically selected and a connection layer is added onto the key layer of each transistor such that the tested transistor is connected with and measured by an outside tester. The key layer is a layer that is tested by the technical personnel and must be reserved, mainly referring to the layer where the transistors are located. If the original layout has a layer for adding pads and a layer including pins, then the layer can be reserved.

Preferably, the added connection layer is a metal layer.

Preferably, the added connection layer comprises a metal layer and a contact layer. The metal layer must be added, and the contact layer is added upon actual situation.

Preferably, a method for testing a plurality of transistors in a target chip comprises the following steps:

Step 1: entering coordinate information of the transistor in a product layout, determining positions to be tested;

Step 2: automatically selecting the transistors and reserving the key layer;

Step 3: automatically identifying pins;

Step 4: automatically adding pads;

Step 5: determining the one-to-one correspondence between the pins and the pads, and completing wiring of the transistors from the pins to the pads; and, Step 6: taping out and testing.

Identify pins in the transistors after selecting the transistors, then adding pads to pins without pads, and finally complete wiring from the pins of the transistors to the pads.

Preferably, in step 1, the metal layers and related layers for interconnecting the transistors are cleared and the key layers of the transistors are reserved in the process of automatically selecting the transistors.

Preferably, in step 3, the automatic identification of chip pins is completed through an automatic algorithm.

Preferably, the algorithm automatically judges if each pin has a contact layer, and if the contact layer does not exist, the key layer is required to be provided with a contact layer for the pin first. After adding the contact layer, directly connect to the outside tester to be tested.

Preferably, the optimal positions for adding the pads are required to be calculated before step 4.

Preferably, the number of the transistors is 1,000 or above.

By adopting the above technical scheme, the present invention achieves obvious technical effects:

The present invention uses automatic tools special for designing the test chip based on the actual product layout to locate the pins, and the tools can automatically identify and fetch devices in the layout and automatically identify and test wires connecting to the device ports, so it is simple and convenient to determine the pins; through automatic generation of the test structures and automatic wiring, the present invention greatly shortens the design cycle of test chip transistor, greatly reduces the error rate in the process of designing the test chip transistor, and improves the testing accuracy.

DETAILED DESCRIPTION OF THE INVENTION

The invention is described in further detail with reference to the attached drawings.

Embodiment 1

A method for testing a plurality of transistors in a target chip is provided. Self-defined transistors on the target chip are automatically selected and a metal layer is added onto the key layer of each transistor such that the tested transistor is connected with and measured by an outside tester.

Figure 1:
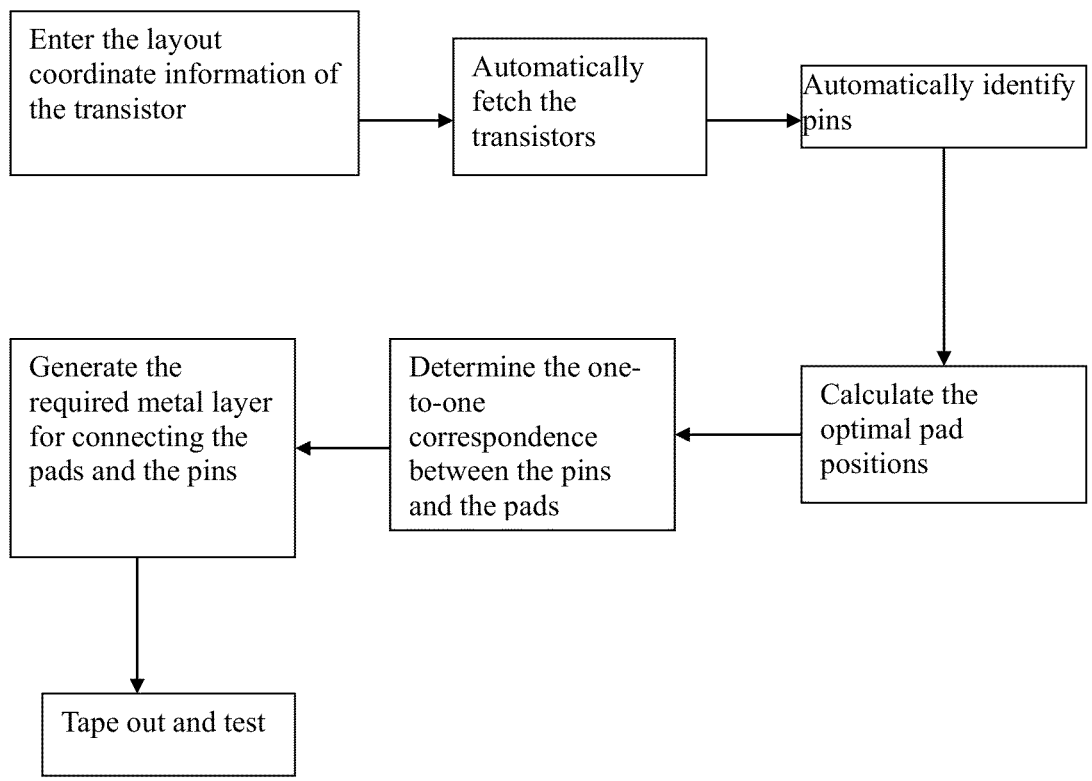
FIG. 1 is a flowchart of the present invention.

As shown in FIG. 1, a method for testing a plurality of transistors in a target chip comprises the following steps:

Step 1: entering coordinate information of the transistor in a product layout, determining positions to be tested;

Step 2: automatically selecting the transistors and reserving the key layer;

Step 3: automatically identifying pins;

Step 4: automatically adding pads;

Step 5: determining the one-to-one correspondence between the pins and the pads, and completing wiring of the transistors from the pins to the pads; and, Step 6: taping out and testing.

In step 1, the metal layer and related layers for interconnecting the transistors are cleared and the key layers include the transistors are reserved in the process of automatically selecting the transistors. In step 3, the automatic identification of chip pins is completed through an automatic algorithm.

Automatically identify pins in the chip layout through automatic algorithm: determine that each transistor has source (S), drain (D), grid (G) and substrate (B) ports, judge if each pin has a contact layer, and if so, rationally continue to use the contact layer design of the original layout.

Then, calculate the optimal pad positions, add the pads, determine the connection relation between the pins and the pads, generate a required metal layer for connecting the pads and the pins, and directly connect the pads and the pins in the layout to complete wiring from the pins of the each transistor to the pads. The number of the transistors is 1,000 or above.

Embodiment 2

A method for testing a plurality of transistors in a target chip is provided. Self-defined transistors on the target chip are automatically selected and a metal layer and a contact layer are added onto the key layer of each transistor such that the tested transistor is connected with and measured by an outside tester.

As shown in FIG. 1, a method for testing a plurality of transistors in a target chip comprises the following steps:

1. entering coordinate information of the transistor in a product layout, determining positions to be tested;

2: automatically selecting the transistors and reserving the key layer;

3: automatically identifying pins;

4: automatically adding pads;

5: determining the one-to-one correspondence between the pins and the pads, and completing wiring of the transistors from the pins to the pads; and, 6: taping out and testing.

In step 1, the metal layer and related layers for interconnecting the transistors are cleared and the key layers include the transistors are reserved in the process of automatically selecting the transistors. In step 3, the automatic identification of chip pins is completed through an automatic algorithm.

Figure 2:
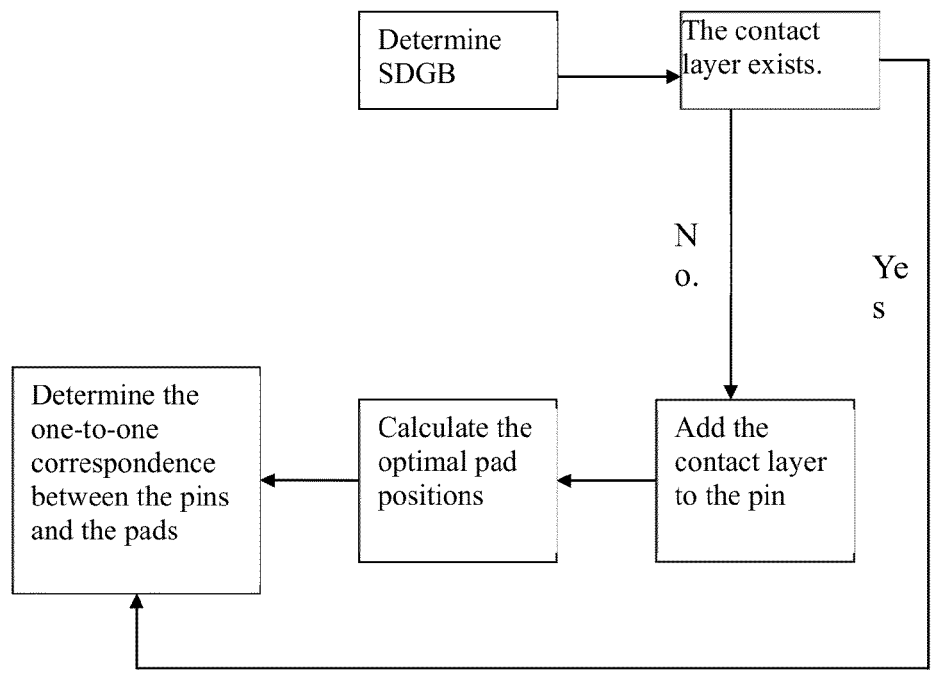
FIG. 2 is a pin identification flowchart of the present invention.

Automatically identify pins in the chip layout through automatic algorithm: as shown in FIG. 2, determine that each transistor has source (S), drain (D), grid (G) and substrate (B) ports, add a contact layer for each pin on the key layer if the pin does not have a contact layer, calculate the optimal pad positions, and add the pads.

Figure 3:
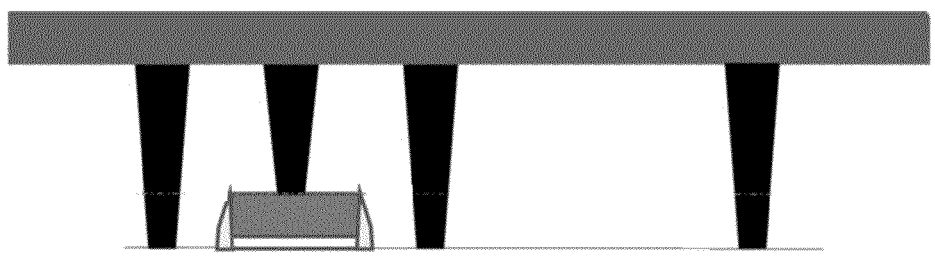
FIG. 3 is a schematic view of adding a layer and pins onto the key layers in the original layout.

FIG. 3 is a section view of the key layer in the original layout added with a contact layer. Add the contact layers to the reserved key layers such as the active, spacer, and poly layers of the reserved of each transistor if detecting that the pins in the layout have no contact layers. Then, calculate the optimal pad positions, add the pads, determine the connection relation between the pins and the pads, generate a required metal layer for connecting the pads and the pins, and directly connect the pads and the pins in the layout to complete wiring from the pins of the each transistor to the pads. The number of the transistors is 1,000 or above.

All in all, the above embodiments are preferably embodiments of the present invention. Any change or modification made within the spirit of the present invention shall fall within the protective scope of the present invention.

What is claimed is:

1. A method for testing a plurality of transistors in a target chip by automatically selecting pre-defined transistors on the target chip and adding a connection layer to key layers of each transistor such that the transistor to be tested is connected with and measured by an outside tester, the method further comprising:

Step 1: entering coordinate information of the transistor in a product layout, determining positions required to be tested;

Step 2: automatically selecting the transistors and keeping the key layer;

Step 3: automatically identifying pins;

Step 4: automatically adding pads;

Step 5: determining the one-to-one correspondence between the pins and the pads, and completing wiring of the transistors from the pins to the pads; and Step 6: taping out and testing.

2. The method for testing a plurality of transistors in a target chip according to claim 1, wherein the added connection layer is a metal layer.

3. The method for testing a plurality of transistors in a target chip according to claim 1, wherein the added connection layer comprises a metal layer and a contact layer.

4. The method for testing a plurality of transistors in a target chip according to claim 2, wherein in step 1, the metal layer and related layers for interconnecting the transistors are cleared and the key layers of the transistors are reserved in the process of automatically selecting the transistors.

5. The method for testing a plurality of transistors in a target chip according to claim 1, wherein in step 3, the automatic identification of chip pins is completed through an automatic algorithm.

6. The method for testing a plurality of transistors in a target chip according to claim 5, wherein the algorithm automatically judges if each pin has a contact layer, and if the contact layer does not exist, it required to add a contact layer on the key layer for the pin first.

7. The method for testing a plurality of transistors in a target chip according to claim 1, wherein before step 4, optimal positions for adding the pads are calculated.

8. The method for testing a plurality of transistors in a target chip according to claim 1, wherein the number of the transistors is 1,000 or above.

* * * * *